US010490691B2

(12) United States Patent
Bour et al.

(10) Patent No.: US 10,490,691 B2
(45) Date of Patent: Nov. 26, 2019

(54) LIGHT EMITTING DIODE WITH DISPLACED P-TYPE DOPING

(71) Applicant: Apple Inc., Cupertino, CA (US)

(72) Inventors: David P. Bour, Cupertino, CA (US); Dmitry S. Sizov, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/746,486

(22) PCT Filed: Jul. 19, 2016

(86) PCT No.: PCT/US2016/042995
§ 371 (c)(1),
(2) Date: Jan. 22, 2018

(87) PCT Pub. No.: WO2017/023535
PCT Pub. Date: Feb. 9, 2017

(65) Prior Publication Data
US 2018/0212097 A1 Jul. 26, 2018

Related U.S. Application Data

(60) Provisional application No. 62/199,960, filed on Jul. 31, 2015.

(51) Int. Cl.
| H01L 33/00 | (2010.01) |
| H01L 33/14 | (2010.01) |
| H01L 33/06 | (2010.01) |
| H01L 33/30 | (2010.01) |
| H01L 33/02 | (2010.01) |

(52) U.S. Cl.
CPC ......... H01L 33/0025 (2013.01); H01L 33/06 (2013.01); H01L 33/14 (2013.01); H01L 33/305 (2013.01); *H01L 33/02* (2013.01)

(58) Field of Classification Search
CPC ... H01L 33/14; H01L 33/145; H01L 33/0025; H01L 33/06
See application file for complete search history.

(56) References Cited

U.S. PATENT DOCUMENTS

| 5,661,742 | A | 8/1997 | Huang et al. |
| 6,489,636 | B1 | 12/2002 | Goetz et al. |
| 6,525,335 | B1 | 2/2003 | Krames et al. |
| 7,067,838 | B1 * | 6/2006 | Sato .................. B82Y 20/00 |
| | | | 257/103 |
| 2001/0020703 | A1 | 9/2001 | Gardner et al. |

(Continued)

FOREIGN PATENT DOCUMENTS

EP  0 886 326 A2  12/1998

OTHER PUBLICATIONS

PCT International Search Report and Written Opinion for International Application No. PCT/US2016/042995, dated Sep. 26, 2016, 10 pages.

*Primary Examiner* — Latanya N Crawford
(74) *Attorney, Agent, or Firm* — Jaffery Watson Mendonsa & Hamilton LLP

(57) ABSTRACT

Light emitting diodes re described. In an embodiment, an LED includes a graded p-side spacer layer on a p-type confinement layer, and the graded p-side spacer layer graded from an initial band gap adjacent the p-type confinement layer to a lower band gap. For example, the graded band gap may be achieved by a graded Aluminum concentration.

27 Claims, 6 Drawing Sheets

(56) References Cited

U.S. PATENT DOCUMENTS

2007/0045609 A1    3/2007   Saxler
2008/0187018 A1    8/2008   Li
2008/0212631 A1*   9/2008   Takeuchi ............... B82Y 20/00
                                                                            372/45.01

* cited by examiner

LIGHT EMITTING DIODE WITH DISPLACED P-TYPE DOPING

RELATED APPLICATIONS

This patent application is a U.S. National Phase Application under 35 U.S.C. § 371 of International Application No. PCT/US2016/042995, filed Jul. 19, 2016, entitled LED EMITTING DIODE WITH DISPLAYED P-TYPE DOPING, which claims the benefit of priority of U.S. Provisional Application No. 62/199,960 filed Jul. 31, 2015, both of which are incorporated herein by reference.

BACKGROUND

Field

Embodiments described herein relate to light emitting diodes (LEDs). More particularly embodiments relate to LEDs with internal drift fields.

Background Information

Light emitting diodes (LEDs) are increasingly being considered as a replacement technology for existing light sources. For example, LEDs are found in signage, traffic signals, automotive tail lights, mobile electronics displays, and televisions. Various benefits of LEDs compared to traditional lighting sources may include increased efficiency, longer lifespan, variable emission spectra, and the ability to be integrated with various form factors.

In one implementation, an inorganic semiconductor-based LED may include an n-doped current spreading layer, an n-doped confinement layer, an active region, a p-doped confinement layer, and a p-doped current spreading layer. Upon application of a forward bias across the LED, holes and electrons are injected into the active region from the p-doped confinement layer and n-doped confinement layer, respectively. Radiative recombination of the electrons and holes in the active region generates light. The band energies of the confinement layer and the active region may be additionally selected to confine the injected holes and electrons in the active region. For example, a conduction band edge between the p-doped confinement layer and the active region may function to confine electrons in the active region, while a valence band edge between the n-doped confinement layer and the active region may function to confine holes in the active region.

SUMMARY

In an embodiment, an LED includes a p-type confinement layer and a graded p-side spacer layer on the p-type confinement layer. The graded p-side spacer layer is graded from an initial band gap adjacent the p-type confinement layer to a lower band gap. An active region including one or more quantum well layers is on the graded p-side spacer layer. The LED further includes an n-side spacer layer on the active region and an n-type confinement layer on the n-side spacer layer. In an embodiment, the LED does not include a graded n-side spacer layer.

The graded p-side spacer layer may include a diffusion profile of a p-dopant (e.g. Mg or Zn) from the p-type confinement layer. In an embodiment, the graded p-side spacer is undoped, other than the diffused p-dopant from the p-type confinement layer. Alternatively, the diffusion profile may end prior to the graded p-side spacer layer (e.g. within the p-type confinement layer). The graded p-side spacer may extend from the p-type confinement layer to the active region. Alternatively, an intermediate p-side spacer layer is located between the graded p-side spacer layer and the active region, where the intermediate p-side spacer layer is not graded. In an embodiment, the graded p-side spacer layer is graded from an initial Aluminum content adjacent the p-type confinement layer composition to a composition with lower Aluminum content. In an embodiment, a p-type dopant concentration in the p-type confinement layer is set back 200-500 nm from the active region. In an embodiment, the p-type dopant concentration is set back 100-200 nm into the p-type confinement layer away from the graded p-side spacer layer. The graded p-side spacer layer may have a thickness such as 100-500 nm, or 50-150 nm, for example. The LED structure may be in the form a discrete LED bonded to a driver contact on a display substrate, or as a bulk LED substrate with a growth substrate, for example, on the n-type confinement layer.

In an embodiment, the LED is formed form an AlGaInP material system. In such an embodiment, the graded p-side spacer layer may be graded from $(Al_xGa_{1-x})_yIn_{1-y}P$ ($0.6 \leq x \leq 1.0$) ($0.4 \leq y \leq 0.6$) adjacent the p-type confinement layer to $(Al_xGa_{1-x})_yIn_{1-y}P$ ($0.2 \leq x \leq 0.8$) ($0.4 \leq y \leq 0.6$). The graded p-side spacer layer may include a diffusion profile of the p-type dopant (e.g. Mg or Zn) from the p-type confinement layer (e.g. AlInP). Alternatively, the diffusion profile may end prior to the graded p-side spacer layer (e.g. within the p-type confinement layer). In an embodiment, a Mg dopant concentration in the p-type confinement layer is set back 200-500 nm from the active region. In an embodiment, the Mg dopant concentration is set back 100-200 nm into the p-type confinement layer away from the graded p-side spacer layer. In an embodiment, the Mg dopant concentration in the p-type confinement layer is $5 \times 10^{17}$ cm$^{-3}$-$1.5 \times 10^{18}$ cm$^{-3}$. In an embodiment, the Mg dopant concentration may be substantially uniform through the p-type confinement layer. In an embodiment, the $(Al_xGa_{1-x})_yIn_{1-y}P$ graded spacer layer includes an Aluminum gradient of $\Delta x \geq 0.3$. In an embodiment, y is equal to about 0.5. The Aluminum content in the p-side graded layer adjacent the p-type confinement layer may be the same as in the p-type confinement layer (e.g. identical compositions such as AlInP), or a lower Aluminum content. In one embodiment, the graded p-side spacer layer is graded from an initial composition of $(Al_xGa_{1-x})_{0.5}In_{0.5}P$, $x=1.0$ adjacent the p-type confinement layer. In such an embodiment, the graded p-side spacer layer may be graded to $(Al_xGa_{1-x})_{0.5}In_{0.5}P$ ($0.2 \leq x \leq 0.7$) at the opposite side of the p-side graded layer nearer the active region. For example, the graded p-side spacer layer may be graded to $x=0.7$, $x=0.5$, or $x=0.2$. In one embodiment, the graded p-side spacer layer is graded from an initial composition of $(Al_xGa_{1-x})_{0.5}In_{0.5}P$, $x=0.7$ adjacent the p-type confinement layer. In such an embodiment, the graded p-side spacer layer may be graded to $(Al_xGa_{1-x})_{0.5}In_{0.5}P$ ($0.2 \leq x \leq 0.5$) at the opposite side of the p-side graded layer nearer the active region. For example, the graded p-side spacer layer may be graded to $x=0.5$ or $x=0.2$.

In an embodiment, the one or more quantum well layers may include GaInP or AlInGaP, and the LED is designed for a peak emission wavelength between 550 nm-850 nm. The LED structure may be in the form a discrete LED bonded to a driver contact on a display substrate, or as a bulk LED substrate with the n-type current spreading layer, for example, formed on a growth substrate (e.g. GaAs).

DETAILED DESCRIPTION

Figure 1:
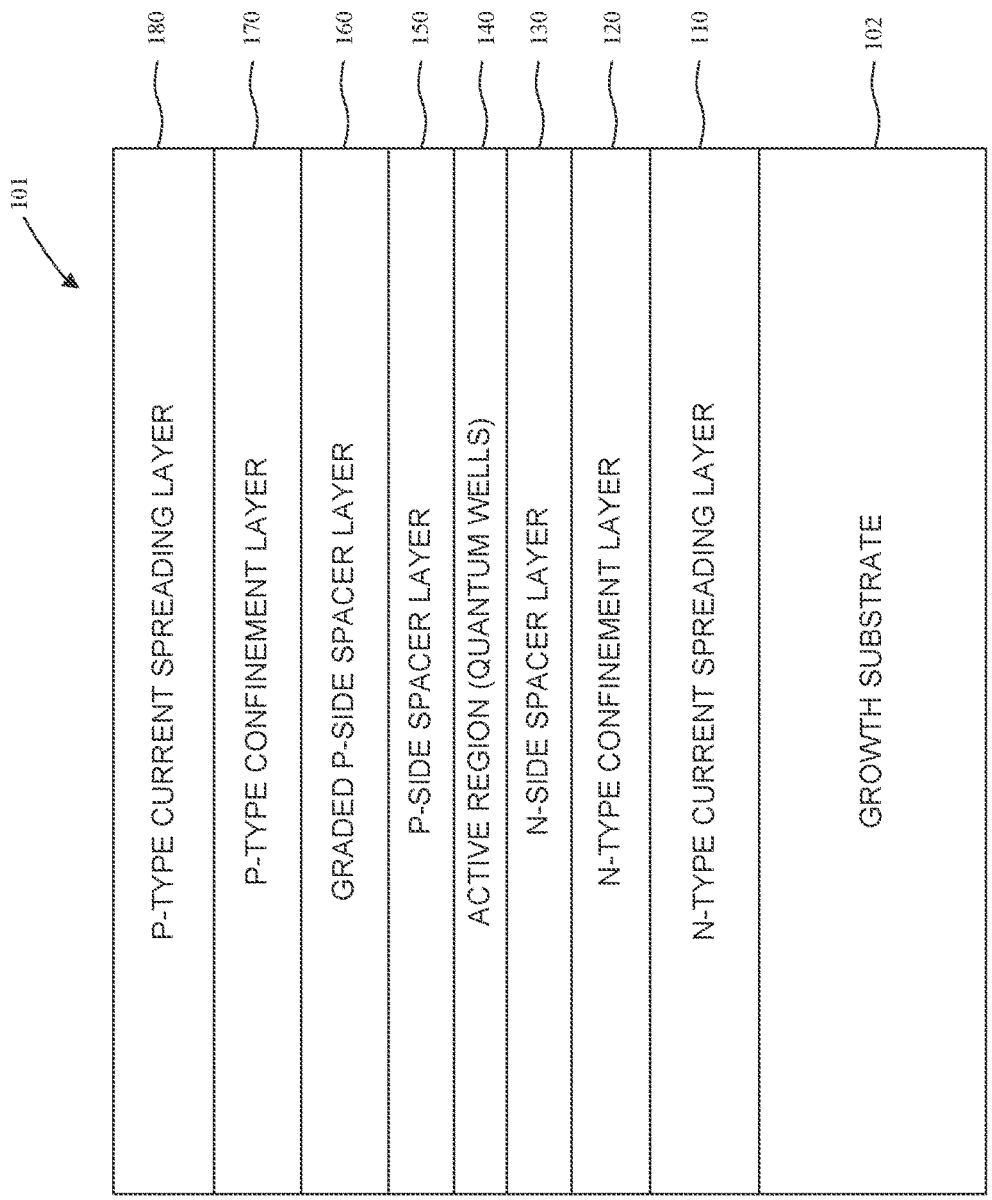
FIG. 1 is a cross-sectional side view illustration is of a bulk LED substrate in accordance with an embodiment.

Embodiments describe LEDs with internal drift fields. In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", and "on" as used herein may refer to a relative position of one layer with respect to other layers. One layer "above", "over", or "on" another layer or bonded "to" or in "contact" with another layer may be directly in contact with the other layer or may have one or more intervening layers. One layer "between" layers may be directly in contact with the layers or may have one or more intervening layers.

In accordance with embodiments, asymmetric LEDs with internal drift fields are described. In an embodiment an LED includes p-type current spreading layer, a p-type confinement layer on the p-type current spreading layer, and a graded p-side spacer layer on the p-type confinement layer. In an embodiment, the graded p-side spacer layer is graded from a composition with an initial band gap adjacent the p-type confinement layer to a composition with a lower band gap. For example, the composition of the graded p-side spacer layer may be graded from an initial Aluminum content adjacent the p-type confinement layer to a lower Aluminum concentration in order to reduce the band gap. In an embodiment, the LED may not include a graded n-side spacer layer. Thus, the LED may be characterized as asymmetric with regard to grading in the spacer layers. As used herein, the term band bap refers to the energy difference (e.g. in electron volts) between the valence band and the conduction band of the material. In accordance with embodiments, the LED additionally includes an active region including one or more quantum well layers on the graded p-side spacer layer, an n-side spacer layer on the active region, an n-type confinement layer on the n-side spacer layer, and an n-type current spreading layer on the n-type confinement layer.

In one aspect, grading the p-side spacer layer may result in a graded band gap of the p-side spacer layer. For example, this may result in a valence band with a negative slope (e.g. increasing energy) as the band gap is reduced (e.g. Aluminum content is reduced). When the LED is subjected to an electric field (e.g. forward bias), it is believed that a drift field is created across the graded p-side spacer layer that accelerates holes toward the quantum wells, which facilitates hole injection. As a result, this may allow for locating the p-dopants further away from the quantum wells, which is expected to preserve low-current efficiency of the LED over the lifetime of the device. In addition, grading the p-side spacer layer may result in reducing drift of electrons that pass by the active region, or even provide an anti-drift field for electrons in the conduction band. This may aid in keeping carrier recombination near the active region, even though p-doping is set back. As a result, electrons may be less likely to reach the p-doped material where they are known to recombine non-radiatively.

It has been observed that AlGaInP red light-emitting LEDs exhibit a degradation of their light output over time. This degradation is particularly pronounced for low-current operation in the pre-droop region of a characteristic internal quantum efficiency (IQE) curve, where the IQE of the LED degrades over time. It is believed that this degradation is attributed to diffusion of the p-dopant (e.g. Magnesium) into the active regions (e.g. quantum wells) as a non-radiative defect. In accordance with embodiments, the p-dopant (e.g. Magnesium) is displaced (set back) from the active region by the insertion of the compositionally graded spacer layer (e.g. AlInGaP) into the p-side of the LED structure. It is believed that such a structure may mitigate degradation and preserve the IQE of the LED, particularly at low currents in the pre-droop region of the IQE curve in which current density may not be high enough to saturate defects during operation of the LED. Setting back of the doping profile may additionally reduce p-n junction capacitance of the LED, since spacing between the p- and n-regions increases, which may correlate to faster reaction of the LED.

In the following description exemplary processing sequences and structures are described for forming LEDs. Referring now to FIG. 1, a cross-sectional side view illustration is provided of a bulk LED substrate 101 in accordance with an embodiment of the invention. The bulk LED substrate 101 structure may be applicable to a variety of compositions and designed emission spectra. For example, the bulk LED substrate 101 may include II-VI materials, III-V nitride materials, or III-V phosphide materials and designed for emission of a variety of emission spectra. For example, the bulk LED substrate 101 may fabricated with a III-V material system (e.g. AlInGaP, AlGaAs, AlInGaAs, InGaAsP) or other material system such as ZnMgBeSSe. In a specific embodiment, the bulk LED substrate 101 is based on an AlInGaP material system and is designed for red color emission. For example, bulk LED substrate 101 may be designed for a peak emission wavelength between 550 nm-850 nm, such as 625 nm. Thus, while the following structures are described with regard to an AlInGaP material system, the exemplary structures may be used for LEDs based on different material systems.

In one embodiment, formation of the bulk LED substrate 101 begins with growth substrate, such as a GaAs growth substrate, for example with a thickness of 250-1,000 µm. Growth substrate 102 may optionally be doped, for example with an n-type dopant such as silicon (Si) or tellurium (Te). Layers 110-180 may then be grown on the growth substrate 102 using a suitable technique such as metal organic chemical vapor deposition (MOCVD). As shown, an n-type current spreading layer 110 is optionally grown on the growth substrate 102, for example to a thickness of 0.1-1.0 µm. In an embodiment, n-type current spreading layer is formed of GaAs with a Si dopant concentration of 0.5 to $4 \times 10^{18}$ cm$^{-3}$. The n-type current spreading layer 110 may not be present for all LED applications. An n-type confinement layer 120 is then grown on the optional n-type current spreading layer 110, for example to a thickness of 0.05-5.0 μm. N-type confinement layer 120 may be formed of materials such as AlInP, AlGaInP, and AlGaAs. In an embodiment, n-type confinement layer 120 is formed of AlInP with a Si dopant concentration of $1 \times 10^{18}$ cm$^{-3}$. Other layers may be grown between the layers 110-180 described herein. For example, there may be one or more layers between the n-type confinement layer 120 and the n-type current spreading layer 110. An n-side spacer layer 130 is then grown on the n-type confinement layer 120, for example to a thickness of 0.05-0.5 μm. N-side spacer layer 130 may be formed of materials such as AlInP, AlGaInP, and AlGaAs. In an embodiment, n-side spacer layer 130 is formed of AlInGaP, and is unintentionally doped during growth. In an embodiment, the n-side spacer does not have a graded composition (e.g. Aluminum content is uniform). An active region 140 is then grown on the n-side spacer layer 130. Active region 140 may include one or more quantum well (QW) layers or bulk active layers. In an embodiment, the one or more quantum well layers or bulk active layers are formed of InGaP or AlInGaP, separated by barrier layers of the same alloy system (e.g. AlInGaP) or composition as one of the adjacent n-side or p-side spacer layers, which may have the same or different compositions and may be graded. A p-side spacer layer 150 is then optionally grown on the active region 140, for example to a thickness of 0.05-0.5 μm, or more specifically approximately 100 nm. P-side spacer layer 150 may be formed of materials such as AlInP, AlGaInP, and AlGaAs. In an embodiment, p-side spacer layer 150 is formed of AlInGaP, and is unintentionally doped during growth. A graded p-side spacer layer 160 is then grown on the p-side spacer layer 150, if present, for example to a thickness of 0.05-1.0 μm, or more specifically approximately 100 nm. In an embodiment, graded p-side spacer layer 160 is 50-150 nm thick. In an embodiment, graded p-side spacer is 100-500 nm thick. Graded p-side spacer layer 160 may be formed of materials such as AlInP, AlGaInP, and AlGaAs. In an embodiment, graded p-side spacer layer 160 is graded AlGaInP with increasing Al concentration during growth and is unintentionally doped during growth. A p-type confinement layer 170 is then grown on the graded p-side spacer layer 160, for example to a thickness of 0.05-1.0 μm, or more specifically approximately 200-500 nm. P-type confinement layer 170 may be formed of materials such as AlInP, AlGaInP, and AlGaAs. In an embodiment, p-type confinement layer 170 is formed of AlInP with a Mg dopant concentration of $5 \times 10^{17}$ cm$^{-3}$-$1.5 \times 10^{18}$ cm$^{-3}$. In an embodiment, the p-type confinement layer 170 may have a substantially uniform p-dopant concentration, less a concentration gradient due to diffusion with the surrounding layers. In an embodiment, the p-dopant concentration is not uniform. For example, doping may begin after a specific set back distance, such as 100-200 nm into the p-type confinement layer 170. In such an embodiment, an initially 100-200 nm of the p-type confinement layer 170 is grown with unintentional doping (e.g. as a result of back-diffusion through crystal material from the subsequently grown doped layer or layers), and then after a specific set back distance has been grown the dopant source is turned on and the remainder of the p-type confinement layer 170 thickness is grown including the p-dopant (e.g. Mg) incorporating directly during the growth process. This portion may, for example, have a substantially uniform p-dopant concentration. In an embodiment, the p-dopant concentration at the set back distance is the maximum p-dopant concentration in the p-type confinement layer, which may correspond to the target p-dopant concentration within the p-type confinement layer 170 for forming the p-n junction. A p-type current spreading layer 180 is then optionally grown on the p-type confinement layer 170, for example to a thickness of 0.1-50.0 μm, for example to 0.1-1.5 μm for a thinner LED. In an embodiment, the optional p-type current spreading layer 180 is formed of GaP, for example, with a Mg or C dopant concentration of $1 \times 10^{18}$ cm$^{-3}$-$1 \times 10^{20}$ cm$^{-3}$.

In accordance with embodiments, the spacer layers 130, 150, 160 may be formed of a material with a large conduction band offset with respect to the one or more quantum well layers in the active region 140. In this aspect, a maximum conduction band offset to the quantum wells confines electrons to the quantum wells. In accordance with embodiments, the doped confinement layers 120, 170 may be selected to have a high band gap in order to confine the injected carriers. For example, the doped confinement layers 120, 170 may have a higher bandgap energy than the adjacent spacer layers. In an embodiment, the spacer layers 130, 150 are $(Al_xGa_{1-x})_yIn_{1-y}P$ alloys with $0.2 \leq x \leq 0.8$ such as $0.5 \leq x \leq 0.8$, and $0.4 \leq y \leq 0.6$ such as about 0.5. In an embodiment, the doped confinement layers 120, 170 are $(Al_xGa_{1-x})_yIn_{1-y}P$ alloys with $0.6 \leq x \leq 1.0$ and $0.4 \leq y \leq 0.6$ such as about 0.5.

In accordance with embodiments, the graded p-side spacer layer 160 may be compositionally graded from an initial band gap adjacent the p-type confinement layer 170 to a lower band gap. For example, the graded p-side spacer layer 160 is graded from an initial Aluminum content adjacent the p-type confinement layer 160 to a composition with lower Aluminum content. In an embodiment, the $(Al_xGa_{1-x})_yIn_{1-y}P$ graded spacer layer 160 includes an Aluminum gradient of $\Delta x \geq 0.3$. The graded p-side spacer layer 160 may be graded over wider Aluminum gradients to produce larger internal drift fields. However, continued reduction of Aluminum content (and lower band gap) may be associated with a trade-off against reduced electron confinement with respect to the quantum wells. This could potentially compromise high-current efficiency of the LEDs with greater electron leakage. However, at low-current operating regimes, for example in the pre-droop region, this may be a reasonable trade-off. Furthermore, the graded band gap may also reduce electron drift or provide an anti-drift field for electrons in the conduction band that offsets reduced electron confinement due to reduced band gap.

The graded p-side spacer layer 160 may eliminate or mitigate an interfacial band offset with the p-type confinement layer 170. The composition grading need not be linear. Grading may take on a more complicated form such as a high-order polynomial. This could be used for example, to compensate for the different rates of band gap energy with response to composition, above and below an indirect-to-direct bandgap crossover point. Grading may be continuous, or with stepped compositions. In order to increase the drift field for holes that results from grading, the Aluminum content of the p-side spacer layer 150, if present, and the grading endpoint of the graded p-side spacer layer 160 may be reduced.

The Aluminum content in the p-side graded layer 160 adjacent the p-type confinement layer 160 may be the same as in the p-type confinement layer 160 (e.g. identical compositions), or a lower Aluminum content. In one embodiment, the graded p-side spacer layer 160 is graded from an initial composition of $(Al_xGa_{1-x})_{0.5}In_{0.5}P$, x=1.0 adjacent the p-type confinement layer 170. In such an embodiment, the graded p-side spacer layer 160 may be graded to $(Al_xGa_{1-x})_{0.5}In_{0.5}P$ ($0.2 \leq x \leq 0.7$) at the opposite side of the p-side graded layer 160 nearer the active region 140. For example, the graded p-side spacer layer 160 may be graded to x=0.7, x=0.5, or x=0.2. In one embodiment, the graded p-side spacer layer 160 is graded from an initial composition of $(Al_xGa_{1-x})_{0.5}In_{0.5}P$, x=0.7 adjacent the p-type confinement layer 170. In such an embodiment, the graded p-side spacer layer 160 may be graded to $(Al_xGa_{1-x})_{0.5}In_{0.5}P$ ($0.2 \leq x \leq 0.5$) at the opposite side of the p-side graded layer 160 nearer the active region 140. For example, the graded p-side spacer layer 160 may be graded to x=0.5 or x=0.2.

Figure 2:
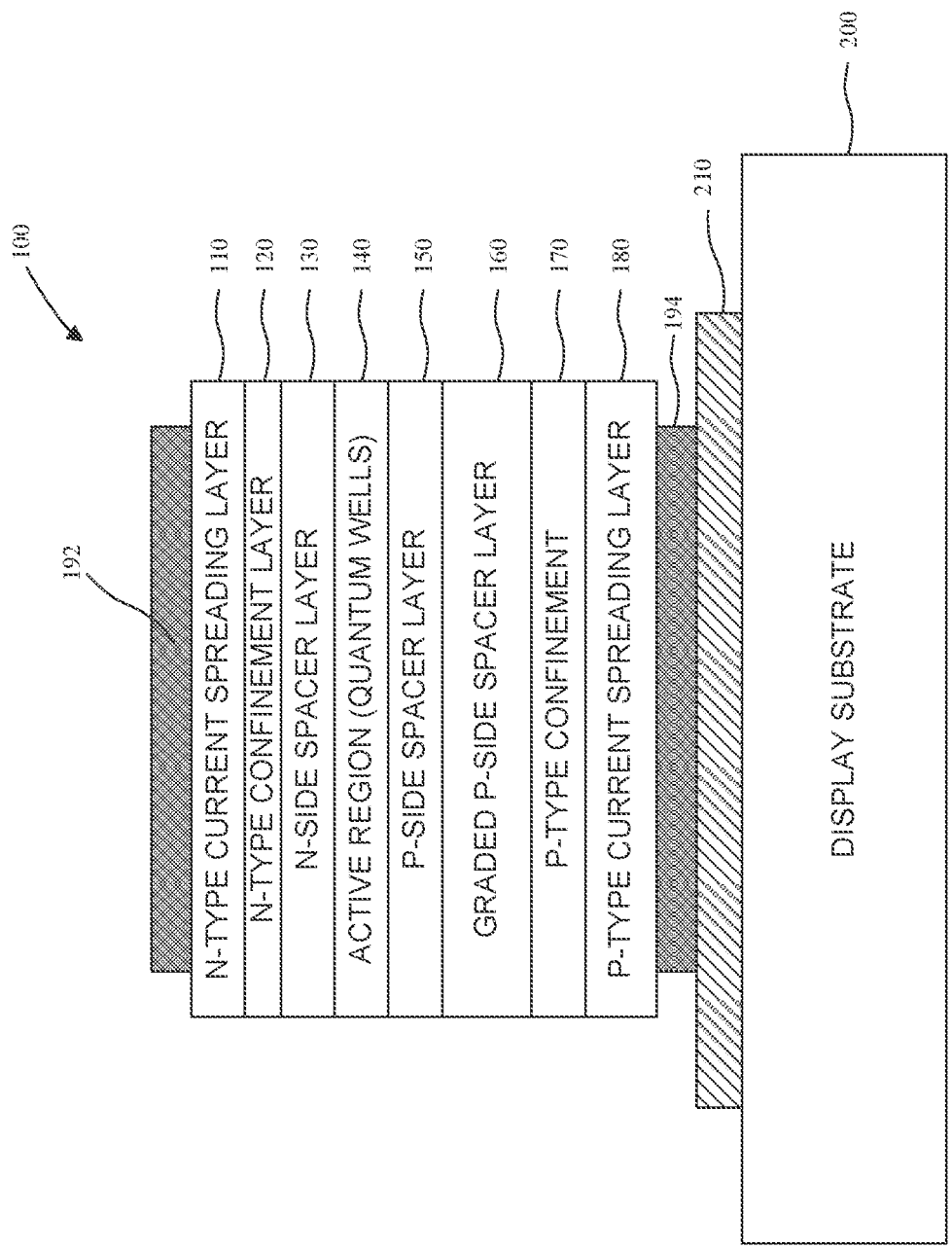
FIG. 2 is a cross-sectional side view illustration of an LED in accordance with an embodiment.

Referring now to FIG. 2, a cross-sectional side view illustration is provided of an LED in accordance with an embodiment. As illustrated, the LED 100 includes a p-type current spreading layer 180, a p-type confinement layer 170 on the p-type current spreading layer 180, and a graded p-side spacer layer 160 on the p-type confinement layer 170. In an embodiment, the graded p-side spacer layer 160 is graded from an initial band gap adjacent the p-type confinement layer 170 composition to lower band gap. For example, the graded p-side spacer layer 160 may be graded from an initial Aluminum content adjacent the p-type confinement layer 170 to a composition with lower Aluminum content in order to reduce the band gap. As illustrated, a p-side spacer layer 150 is optionally over the graded p-side spacer layer 160. In accordance with embodiments, the LED 100 additionally includes an active region 140 including one or more quantum well layers on the graded p-side spacer layer 160 (or optional p-side spacer layer 150), an n-side spacer layer 130 on the active region 140, an n-type confinement layer 120 on the n-side spacer layer 130, and an n-type current spreading layer 110 on the n-type confinement layer 120.

As shown, a conductive contact 192 may be formed on the n-type current spreading layer 110, and a conductive contact 194 may be formed on the p-type current spreading layer 180. Conductive contacts 192, 194 may be formed of a variety of materials including metals, conductive oxides, and conductive polymers. In an embodiment, conductive contacts are formed using a suitable technique such as evaporation or sputtering. In an embodiment, conductive contacts may include BeAu metal alloy, or metal stack of Au/GeAu/Ni/Au layers. In the particular embodiment illustrated, conductive contact 194 is bonded to a driver contact 210 on a display substrate 200. Alternatively, the conductive contact 192 may be bonded to the driver contact 210.

Figure 3:
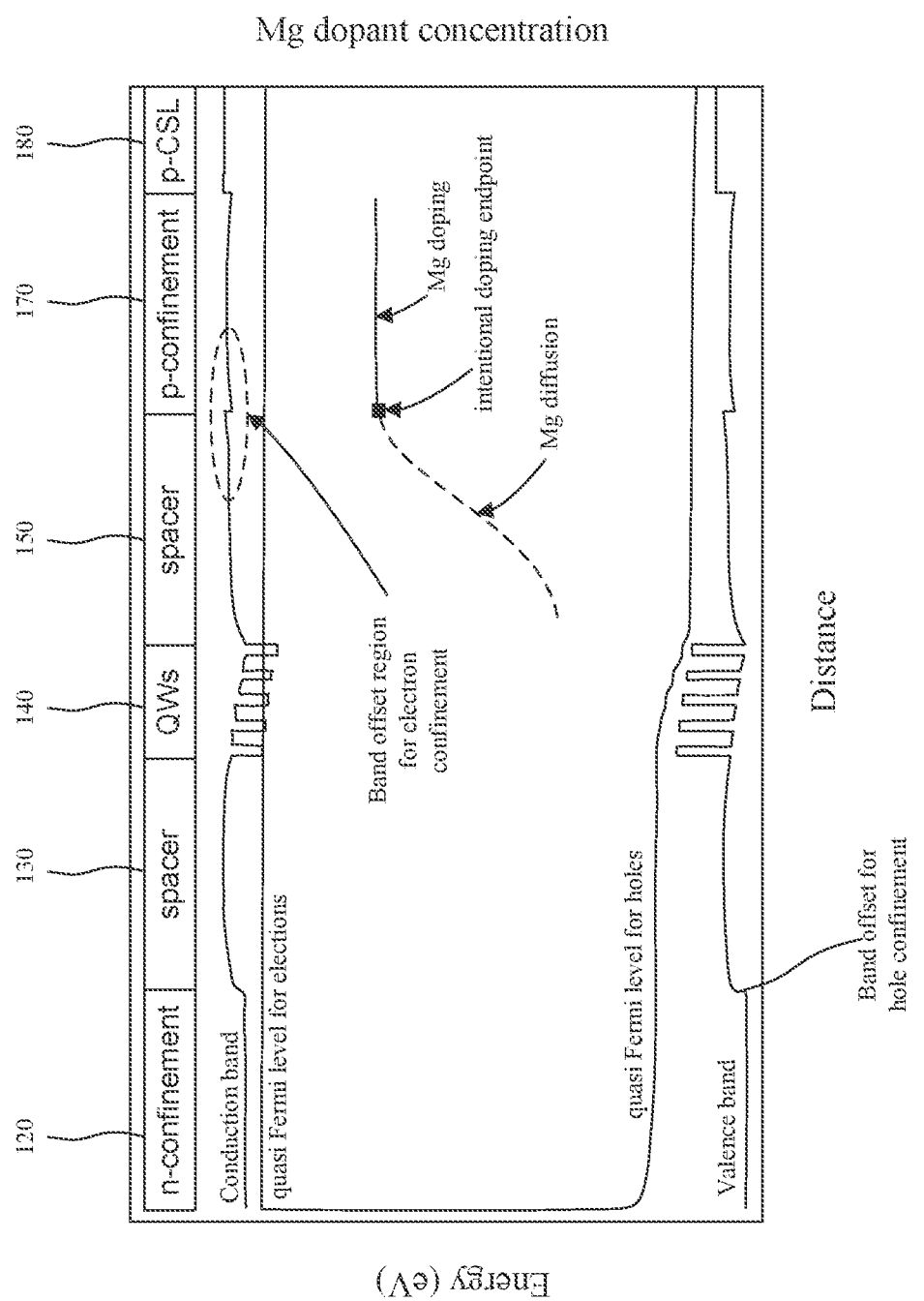
FIG. 3 is a simulated band diagram for comparative LED Example 1.

Referring now to FIG. 3 a simulated band diagram is provided for comparative LED Example 1 under forward bias of 2V, and current density of 200 A/cm$^2$. The compositions, layer thicknesses, and intentional dopant concentrations of comparative LED Example 1 are provided in Table 1.

TABLE 1

Comparative LED Example 1

| Layer | Composition | Thickness | Dopant concentration |
|---|---|---|---|
| p-type current spreading layer | p-GaP | 500 nm | [Mg] = 1 × 10$^{18}$ cm$^{-3}$ |
| p-type confinement layer | p-Al$_{0.5}$In$_{0.5}$P | 100 nm | [Mg] = 5 × 10$^{17}$ cm$^{-3}$ |
| p-side spacer layer | (Al$_{0.7}$Ga$_{0.3}$)$_{0.5}$In$_{0.5}$P | 100 nm | |
| active region (5 quantum wells) | GaInP quantum wells separated by (Al$_{0.7}$Ga$_{0.3}$)$_{0.5}$In$_{0.5}$P barrier layers | | |
| n-side spacer layer | (Al$_{0.7}$Ga$_{0.3}$)$_{0.5}$In$_{0.5}$P | 100 nm | |
| n-type confinement layer | n-Al$_{0.5}$In$_{0.5}$P | 100 nm | [Si] = 1 × 10$^{18}$ cm$^{-3}$ |
| n-type current spreading layer | n-GaAs | thick | [Si] = 4 × 10$^{18}$ cm$^{-3}$ |

Referring to Table 1 and FIG. 3, the p-type confinement layer 170 is doped with a Mg concentration of 5×10$^{17}$ cm$^{-3}$. A graded p-side spacer layer is not formed. It has been observed that, while Mg provides adequate holes for injection, Mg also diffuses into the p-side spacer layer 150. For example, this may occur during MOCVD growth when forming the bulk LED substrate.

Figure 4:
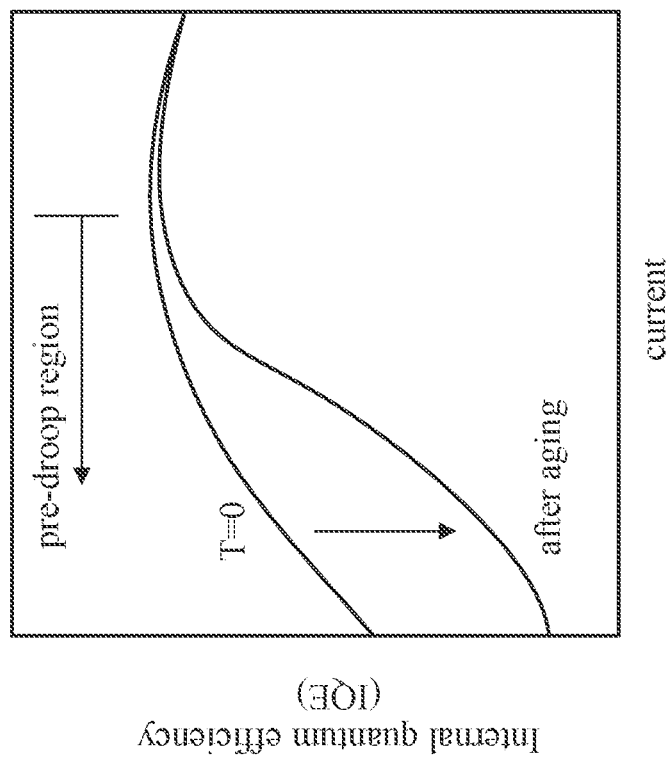
FIG. 4 is a generalized IQE curve for comparative Example 1.

Referring now to FIG. 4, a generalized IQE curve is illustrated for comparative Example 1 over time. As shown, low-current degradation has been observed in the "pre-droop" region of the IQE curve over time. In particular, low-current degradation as a function of the square root of time has been observed, suggesting that the degradation is attributed to a diffusion process. This suggests that Mg additionally diffuses toward the active region over time, after growth, as a non-radiative defect that degrades luminescence and IQE of the LED.

In accordance with embodiments, the intentional doping endpoint for Mg doping may be set back from the quantum wells, for example, an additional 100-200 nm. While this may have the effect of moving the Mg dopant concentration profile to the right in FIG. 3, this also displaces the p-n junction from the active region 140, inhibiting hole injection and IQE of the LED. As a result, the characteristic IQE curve illustrated in FIG. 4 may be shifted down, for example.

In accordance with embodiments, LEDs include a graded p-side spacer layer 160 that promotes hole injection adjacent to the p-side of the active region 140. The graded potential associated with the compositionally graded p-side spacer layer 160 creates an internal field (drift field) by which holes may drift toward the active region 140. In this manner, the LEDs may tolerate p-dopant (e.g. Mg) profiles that are further displaced from the active region. For example, the drift field may increase IQE of the LEDs sufficiently to off-set a potential reduction in IQE due to the displaced Mg. The structures may also improve stability of the low-current IQE of the LED over time as a consequence of the displaced Mg.

Figure 5:
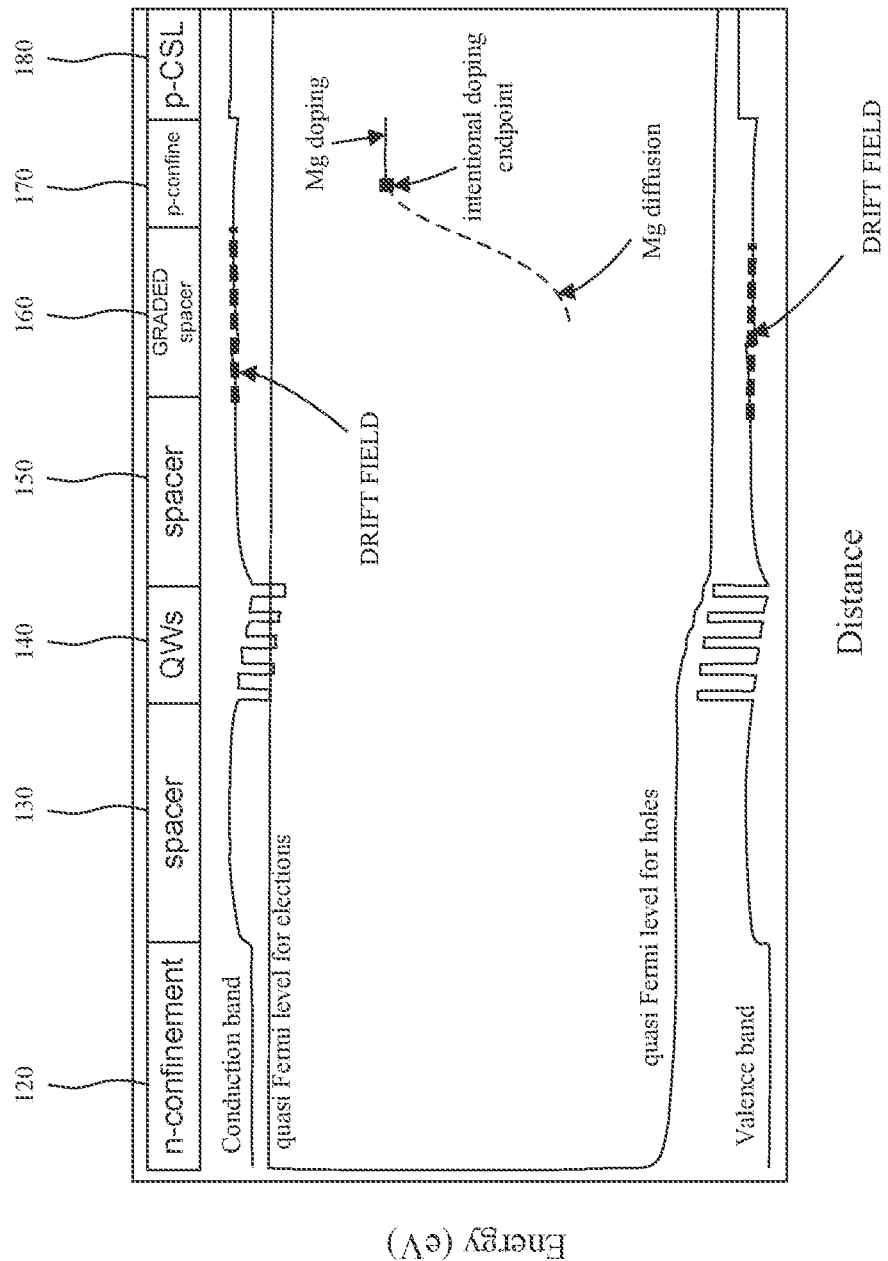
FIGS. 5-6 are modified band diagrams for LEDs including graded p-side spacer layers and displaced Mg profiles in accordance with embodiments.

In one embodiment, a graded p-side spacer layer 160 is inserted between the p-side spacer layer 150 and the p-type confinement layer 170 of comparative LED Example 1. Referring now to FIG. 5, a modified band diagram from FIG.

3 is illustrated in which the LED structure includes a graded p-side spacer layer 160 and displaced Mg profile in accordance with an embodiment. In the particular embodiment illustrated, the graded p-side spacer layer 160 replaces portions of the p-side spacer layer 150 and the p-type confinement layer 170 from comparative LED Example 1, though this is not required and an additional graded p-side spacer layer 160 may be formed between the p-side spacer layer 150 and the p-type confinement layer 170 from comparative LED Example 1. In an embodiment, the graded p-side spacer layer 160 may have a thickness of 1-300 nm. Thicknesses of the p-side spacer layer 150 and the p-type confinement layer 170 may optionally be changed. In an embodiment, the intentional doping endpoint for the Mg doping is located 200-500 nm from the active region 140, and greater than that for a traditional LED without the graded spacer layer. As illustrated, the diffused Mg diffusion profile extends to near the graded p-side spacer layer, or into the graded p-side spacer layer 160. In an embodiment, the intentional doping endpoint of the p-type dopant (e.g. Mg) is set back into the p-type confinement layer 170. In an embodiment, the intentional doping endpoint is set back 100-200 nm into the p-type confinement layer 170. Thus, the intentional doping endpoint can be set back from the active region 140 by the thicknesses of the p-side spacer layer 150, graded p-side spacer layer 160, and set back distance into the p-type confinement layer 170. In an embodiment, the p-side spacer layer 150 is 100 nm thick, graded p-side spacer layer 160 is 100 nm thick, and set back distance into the p-type confinement layer 170 is 100 nm to achieve a 300 nm set back distance from the active region 140.

Still referring to FIG. 5, the graded p-side spacer layer 160 induces a drift field that promotes hole injection into the active region 140 quantum wells. The drift field is illustrated in FIG. 5 as dashed lines in the conduction band and valence band, overlying the band diagram for comparative LED Example 1. As shown, the drift field in the modified valence band may have a negative slope with increasing band energy in the graded p-side spacer layer 160 moving in the direction from the p-type confinement layer 170 toward the p-side spacer layer 150. Similarly, the drift field for electrons in the conduction band may have a positive slope in the graded p-side spacer layer 160 moving in the direction from the p-side spacer layer 150 toward the p-type confinement layer 170. In accordance with embodiments, the graded p-side spacer layer 160 is characterized as having a graded band gap, which decreases from an initial band gap adjacent the p-type confinement layer 170 to a lower band gap in the direction toward the active region 140 quantum wells.

Figure 6:
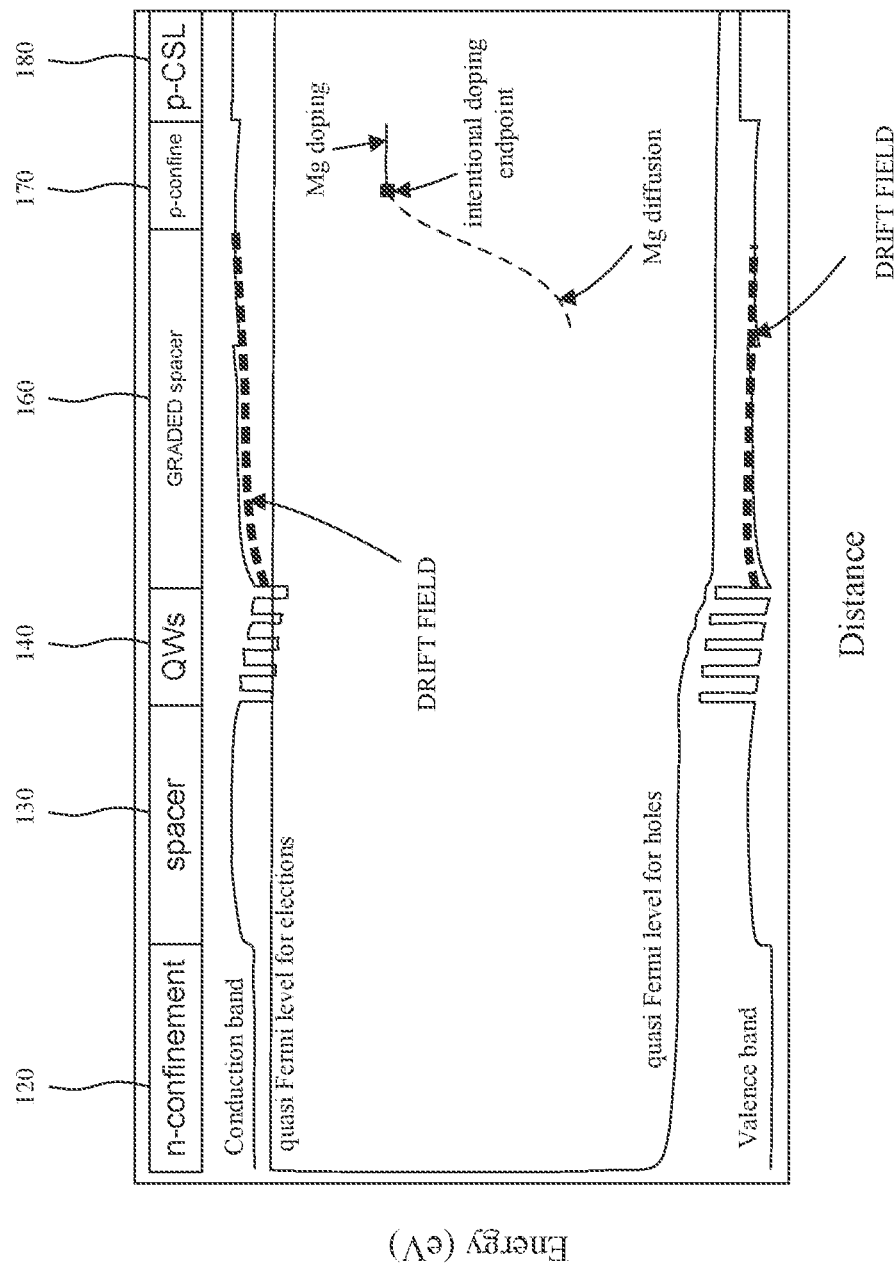

Referring now to FIG. 6, a modified band diagram from FIG. 3 is illustrated in which the LED structure includes a graded p-side spacer layer 160 and displaced Mg profile in accordance with an embodiment. The LED structure illustrated in FIG. 6 is similar to that illustrated in FIG. 5, with one difference being the extension of the graded p-side spacer layer 160 to the active region 140, and the elimination of a separate p-side spacer layer 150. Similar to FIG. 5, in an embodiment the intentional doping endpoint for the Mg doping may be located 200-500 nm from the active region 140.

In accordance with embodiments, any of the graded p-side spacer layers 160 described herein may be graded from an initial band gap adjacent the p-type confinement layer 170 to a lower band gap. For example, the graded p-side spacer layer 160 is graded from an initial Aluminum content adjacent the p-type confinement layer 160 to a composition with lower Aluminum content. In an embodiment, the graded p-side spacer layer 160 is graded from $(Al_xGa_{1-x})_yIn_{1-y}P$ ($0.6 \leq x \leq 1.0$) ($0.4 \leq y \leq 0.6$) adjacent the p-type confinement layer 160 to $(Al_xGa_{1-x})_yIn_{1-y}P$ ($0.2 \leq x \leq 0.8$) ($0.4 \leq y \leq 0.6$). In an embodiment, y is equal to about 0.5. The composition may be graded over a wider range of Aluminum content in order to produce a stronger internal drift field for efficient hole injection. This grading may be associated with a trade-off against reduced electron confinement with respect to the active region quantum wells, though the grading may also reduce electron drift or even provide an anti-drift field for electrons in the conduction band. Even if the proposed structure potentially results in a net increase in electron leakage, it is believed this may be a reasonable tradeoff for preserving LED efficiency over the lifetime of the device, particularly for low-current regimes.

In utilizing the various aspects of the embodiments, it would become apparent to one skilled in the art that combinations or variations of the above embodiments are possible for forming an LED with internal drift field. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An LED comprising:
    a p-type confinement layer;
    a graded p-side spacer layer on the p-type confinement layer, the graded p-side spacer layer graded from an initial band gap adjacent the p-type confinement layer to a lower band gap;
    an active region on the graded p-side spacer layer;
    an n-side spacer layer on the active region; and
    an n-type confinement layer on the n-side spacer layer;
    wherein a diffusion profile of a p-dopant from the p-type confinement layer extends into a region of the graded p-side spacer layer that is otherwise undoped.

2. The LED of claim 1, wherein the graded p-side spacer layer extends from the p-type confinement layer to the active region.

3. The LED of claim 1, further comprising an intermediate p-side spacer layer between the graded p-side spacer layer and the active region, wherein the intermediate p-side spacer layer is not graded.

4. The LED of claim 1, wherein the intentionally doped region is 200-500 nm from the active region.

5. The LED of claim 4, wherein the graded p-side spacer layer is about 100-500 nm thick.

6. The LED of claim 4, wherein the graded p-side spacer layer is about 50-150 nm thick.

7. The LED of claim 4, wherein the LED does not include a graded n-side spacer layer.

8. The LED of claim 4, wherein the set back region is 100-200 nm thick, and the set back region and the intentionally doped region are formed of a same semiconductor composition.

9. An LED comprising:
    a p-type confinement layer comprising an intentionally doped region and a set back region on the intentionally doped region, wherein the intentionally doped region is doped with a p-type dopant concentration;
    a graded p-side spacer layer on the set back region of the p-type confinement layer, wherein the graded p-side spacer layer is graded from an initial band gap adjacent the set back region to a lower band gap;
    an active region on the graded p-side spacer layer;

an n-side spacer layer on the active region; and an n-type confinement layer on the n-side spacer layer;

wherein a diffusion profile of the p-type dopant extends from the intentionally doped region, through set back region, and into the graded p-side spacer layer.

10. The LED of claim 9, wherein the p-type dopant concentration is substantially uniform in the intentionally doped region.

11. An LED comprising:

a p-type confinement layer;

a graded p-side spacer layer on the p-type confinement layer and, the graded p-side spacer layer graded from $(Al_xGa_{1-x})_yIn_{1-y}P$ ($0.6 \leq x \leq 1.0$) ($0.4 \leq y \leq 0.6$) adjacent the p-type confinement layer to $(Al_xGa_{1-x})_yIn_{1-y}P$ ($0.2 \leq x \leq 0.8$) ($0.4 \leq y \leq 0.6$);

an active region on the graded p-side spacer layer;

an n-side spacer layer on the active region; and an n-type confinement layer on the n-side spacer layer.

12. The LED of claim 11, wherein the graded p-side spacer layer comprises a diffusion profile of a p-type dopant from the p-type confinement layer.

13. The LED of claim 11, wherein the p-type confinement layer comprises a p-type dopant selected from the group consisting of Mg and Zn.

14. The LED of claim 13, wherein the p-type dopant is Mg.

15. The LED of claim 14, wherein a Mg dopant concentration in the p-type confinement layer is set back about 200-500 nm from the active region.

16. The LED of claim 15, wherein the graded layer is about 100-500 nm thick.

17. The LED of claim 15, wherein the graded layer is about 50-150 nm thick.

18. The LED of claim 15, wherein the Mg dopant concentration is set back about 100-200 nm into the p-type confinement layer away from the graded p-side spacer layer.

19. The LED of claim 15, wherein the p-type confinement layer comprises AlInP.

20. The LED of claim 15, wherein the graded spacer layer includes an Aluminum gradient of $\Delta x \geq 0.3$.

21. The LED of claim 20, wherein y is equal to about 0.5.

22. The LED of claim 21, wherein an initial Aluminum content adjacent the p-type confinement layer is $(Al_xGa_{1-x})_{0.5}In_{0.5}P$, $x=1.0$.

23. The LED of claim 22, wherein the graded p-side spacer layer is graded to $(Al_xGa_{1-x})_{0.5}In_{0.5}P$ ($0.2 \leq x \leq 0.7$).

24. The LED of claim 21, wherein an initial Aluminum content adjacent the p-type confinement layer is $(Al_xGa_{1-x})_{0.5}In_{0.5}P$, $x=0.7$.

25. The LED of claim 24, wherein the graded p-side spacer layer is graded to $(Al_xGa_{1-x})_{0.5}In_{0.5}P$ ($0.2 \leq x \leq 0.5$).

26. The LED of claim 15, wherein the Mg dopant concentration in the p-type confinement layer is about $5 \times 10^{17} cm^{-3}$-$1.5 \times 10^{18} cm^{-3}$.

27. The LED of claim 26, wherein the LED does not include a graded n-side side spacer layer.

* * * * *